United States Patent [19]

Wolke

[11] Patent Number: 4,994,692
[45] Date of Patent: Feb. 19, 1991

[54] QUANTIZER SYSTEM

[75] Inventor: Alan E. Wolke, Ringoes, N.J.

[73] Assignee: AMP Incorporated, Harrisburg, Pa.

[21] Appl. No.: 437,476

[22] Filed: Nov. 15, 1989

[51] Int. Cl.[5] .......................................... H03K 3/295
[52] U.S. Cl. ................................... 307/494; 307/354; 307/359; 307/360; 307/362
[58] Field of Search .............. 307/494, 354, 359, 360, 307/362; 328/14

[56] References Cited

U.S. PATENT DOCUMENTS

| | | | |
|---|---|---|---|
| 3,309,618 | 3/1967 | Harris et al. | 307/359 |
| 4,151,482 | 2/1978 | Robe | 330/308 |
| 4,163,909 | 8/1979 | Harr | 307/359 |
| 4,449,102 | 5/1984 | Frazer | 307/359 |
| 4,581,545 | 4/1986 | Beale et al. | 307/359 |
| 4,641,378 | 6/1984 | McConnell et al. | 445/619 |

Primary Examiner—Stanley D. Miller
Assistant Examiner—Scott A. Ouellette

[57] ABSTRACT

A quantizer system for transforming an input signal into an appropriate one of two logic levels. The system compares the received input signal with a threshold voltage and provides an output signal at one of the two logic levels when the input signal exceeds the threshold voltage and at the other of the two logic levels when the input signal is less than the threshold voltage. Circuitry is provided to generate the threshold voltage at a level which is the midpoint of the input signal range. This circuitry includes a feedback loop around a differential amplifier to one input of which is applied the input signal. The feedback loops includes two peak detectors feeding an operational amplifier, the output of which is applied to the other input of the differential amplifier.

12 Claims, 5 Drawing Sheets

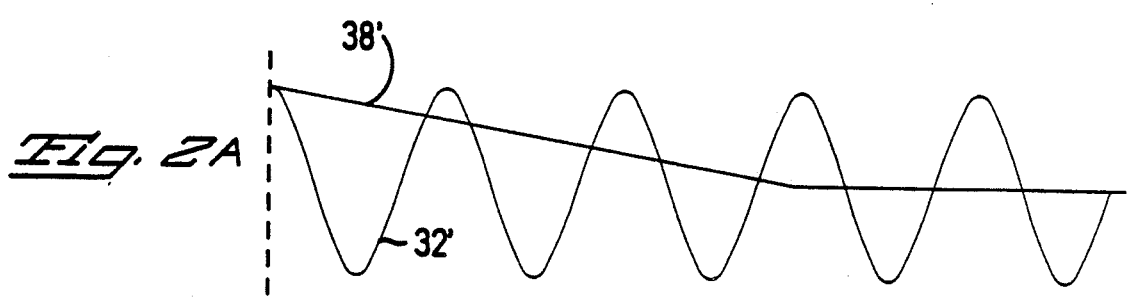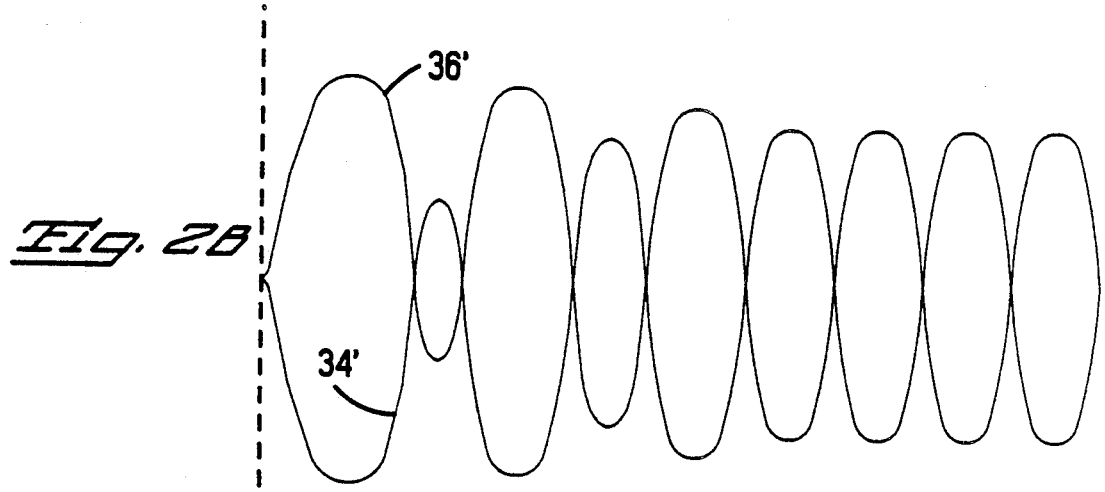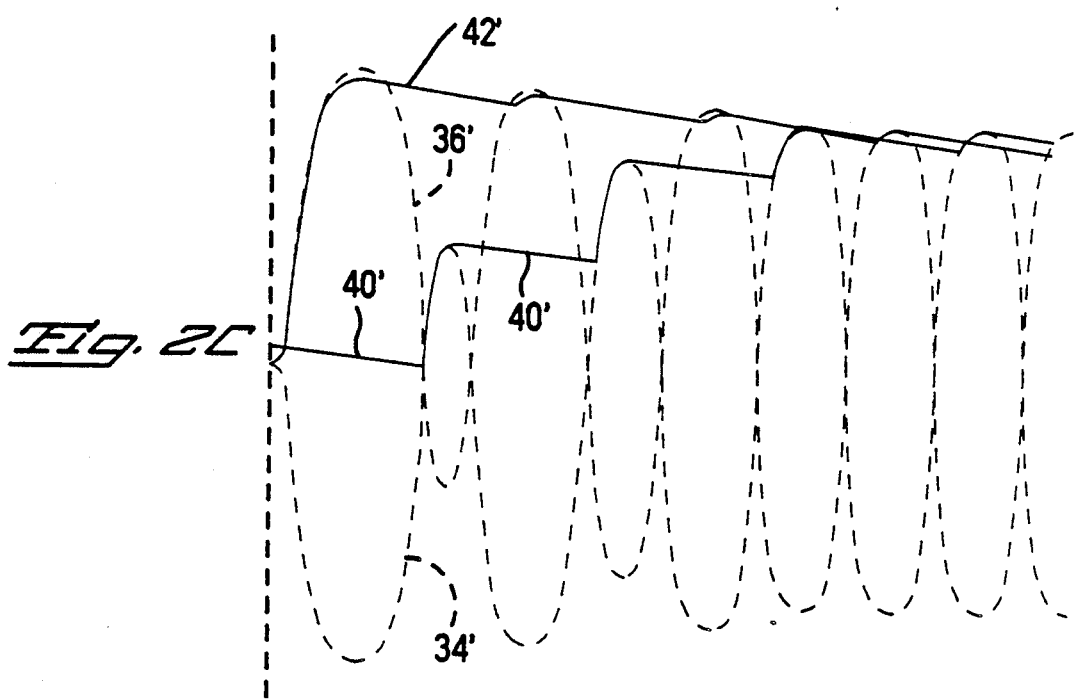

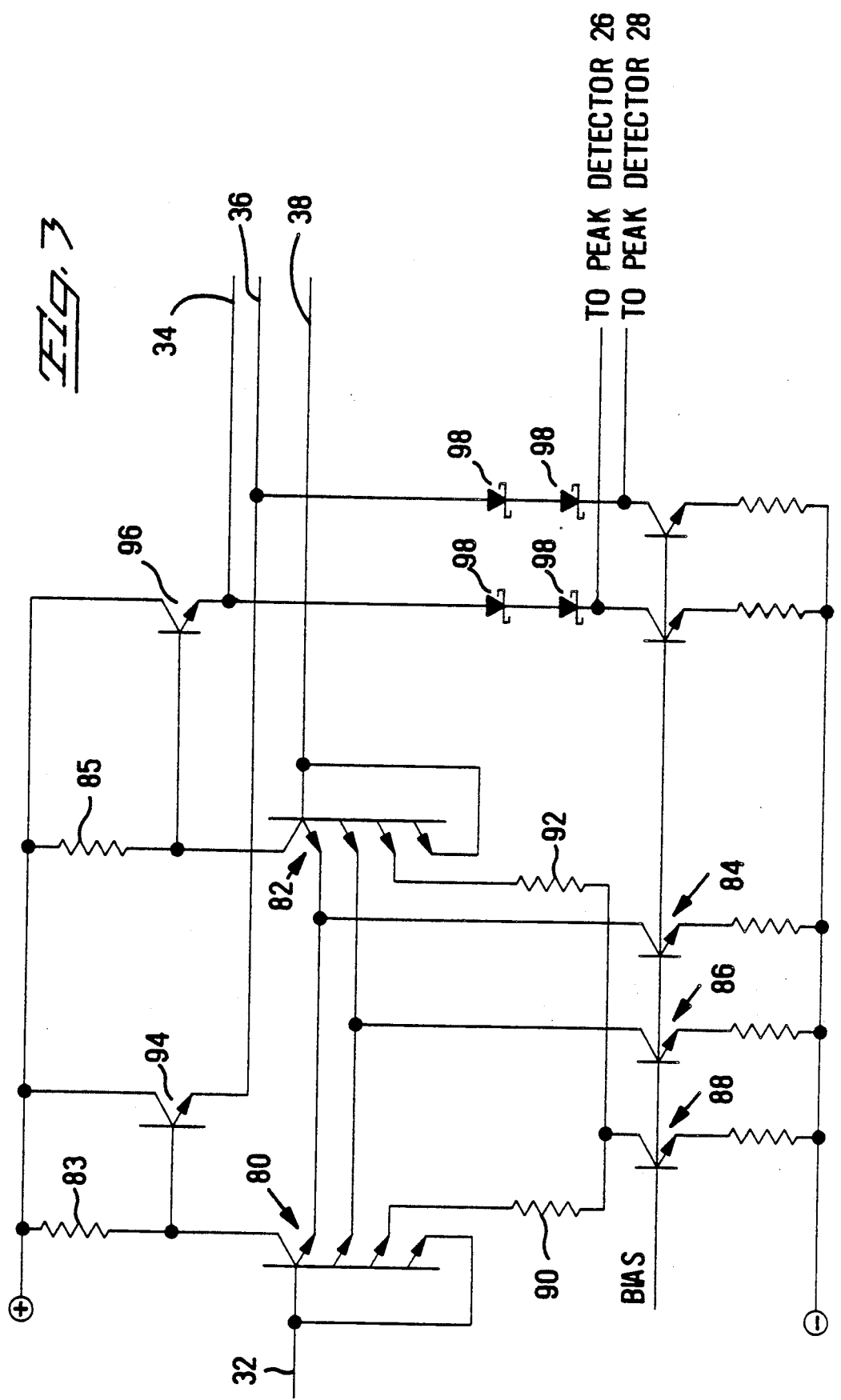

QUANTIZER SYSTEM

BACKGROUND OF THE INVENTION

This invention relates to signal receiver systems and, more particularly, to circuitry within the receiver for transforming the input signal applied thereto into an appropriate one of two logic levels.

In optical transmission systems, information signals are typically transmitted over fiber optic lines as digital light pulses. These light pulses must be converted to voltage pulses for processing by the receiver system. Typically, the incoming light impinges on a photodetector which is coupled to the input of a preamplifier. The peak-to-peak output voltage of the preamplifier will typically lie in the range of 5 millivolts to almost 1.5 volts. This voltage must be amplified, an appropriate threshold must be determined, and the signal must be quantized with respect to this threshold to produce the appropriate one of two logic levels.

The above-mentioned threshold refers to the voltage level to which the incoming signal is compared to determine if a logic "1" or a logic "0" is being received. Since the optical transmission scheme is non return to zero (NRZ), these two conditions refer to "receiving light" and "receiving no light", respectively. During any given transmission period, this will define two distinct output voltage levels from the preamplifier. The magnitude of the output voltage is determined by the amount of optical flux illuminating the photodetector and the gain of the preamplifier. Because of the bandwidth of the fiber optic transmission medium and of the preamplifier, the original data square wave is reshaped into a sinusoidal wave. When the data is recovered, it is imperative that: (1) the proper logic level be chosen; and (2) the proper transition point be determined so that a clock signal can be recovered from the data stream. To achieve these results, the signal to noise ratio must be maximized for both the low and high levels of the degraded pulses. Accordingly, the switching threshold should be midway between the low and high peaks of the signal.

Traditionally, high speed digital fiber optic data systems have taken the approach of attempting to attain a 50% duty cycle for the logic levels in the data stream in order to simplify the data recovery circuitry. If the data stream has a 50% duty cycle, the optimum threshold voltage is determined by simply averaging the incoming signal level. To attain the 50% duty cycle, system designers have utilized various coding schemes. These coding schemes include biphase codes (i.e., Manchester coding), but such a coding scheme is highly inefficient in that the transmission bandwidth is twice the information band- width. To make more efficient use of the transmission bandwidth, substitution type coding schemes (i.e., four bit to five bit or eight bit to ten bit) are sometimes implemented. These codes can be designed to be statistically balanced, but in reality, they can have long durations where the duty cycle significantly differs from 50%. With the conventional "average value" detection receivers, the calculated threshold will not be at the midpoint of the incoming signal during these times.

If the threshold is not at the midpoint of the incoming signal, a number of detrimental effects will result. One such effect is that the quantized output pulses will have pulse width distortion due to the timing error resulting from the threshold moving up or down the rising and falling edges of the incoming signal pulse. Further, the sensitivity of the receiver is reduced. Sensitivity is a function of the signal to noise ratio between the threshold and the incoming signal. As the threshold is moved toward either voltage extreme of the incoming signal, the signal to noise ratio between them is reduced, increasing the probability of not properly detecting that pulse. Accordingly, it is a primary object of this invention to accurately define the midpoint of the incoming signal, so as to maximize the signal to noise ratio for both of the signal levels.

Other problems arise due to the levels of the incoming signal. As previously mentioned, the input signal can vary over at least a 20 db range (i.e., from 5 millivolts to 1.5 volts peak to peak), although during a single transmission period the range is substantially constant. Because of the low signal levels, amplification is required. In particular, it has been common to utilize a multi-stage amplifier which is AC coupled. This has the disadvantage that the capacitor between stages removes the DC information, so that in effect the system becomes an average value detector rather than one where the threshold is midway between the peaks. This is another reason why prior system designs have been constrained to attain a 50% duty cycle of the data stream. However, if the duty cycle varies from 50%, the peak values are important and cannot be clipped. It is therefore another object of this invention to provide a system where the signal is not clipped before quantizing is effected. This requires that higher level input signals are amplified less than lower level input signals.

SUMMARY OF THE INVENTION

The foregoing, and additional, objects are attained in accordance with the principles of this invention by providing a system for quantizing an input signal to two levels, where the input signal varies in a range between a first voltage value and a second voltage value. The system comprises means for receiving the input signal, means for comparing the input signal with a threshold voltage and providing an output signal at one of the two levels when the input signal exceeds the threshold voltage and at the other of the two levels when the input signal is less than the threshold voltage, and means for providing the threshold voltage at a level which is the midpoint of the input signal range. This determination of the threshold voltage is substantially transparent to off-50% duty cycle data streams.

In accordance with an aspect of this invention, the comparing means includes a differential amplifier having first and second inputs and first and second outputs, where the first input is coupled to receive the input signal and the second input is coupled to receive the threshold voltage. The threshold voltage providing means includes a feedback loop around the differential amplifier, the feedback loop having a first peak detector coupled to the differential amplifier first output and a second peak detector coupled to the differential amplifier second output.

In accordance with a further aspect of this invention, the feedback loop also includes an operational amplifier having a first input coupled to the first peak detector, a second input coupled to the second peak detector, and an output coupled to the second input of the differential amplifier.

BRIEF DESCRIPTION OF THE DRAWINGS

The foregoing will be more readily apparent upon reading the following description in conjunction with the drawings in which like elements in different figures thereof have the same reference numeral and wherein:

FIGS. 2A, 2B and 2C illustrate waveforms useful in understanding the operation of the system shown in FIG. 1;

FIG. 3 is a detailed schematic diagram of an illustrative non-linear differential amplifier which may be used in the system shown in FIG. 1;

DETAILED DESCRIPTION

Figure 1:
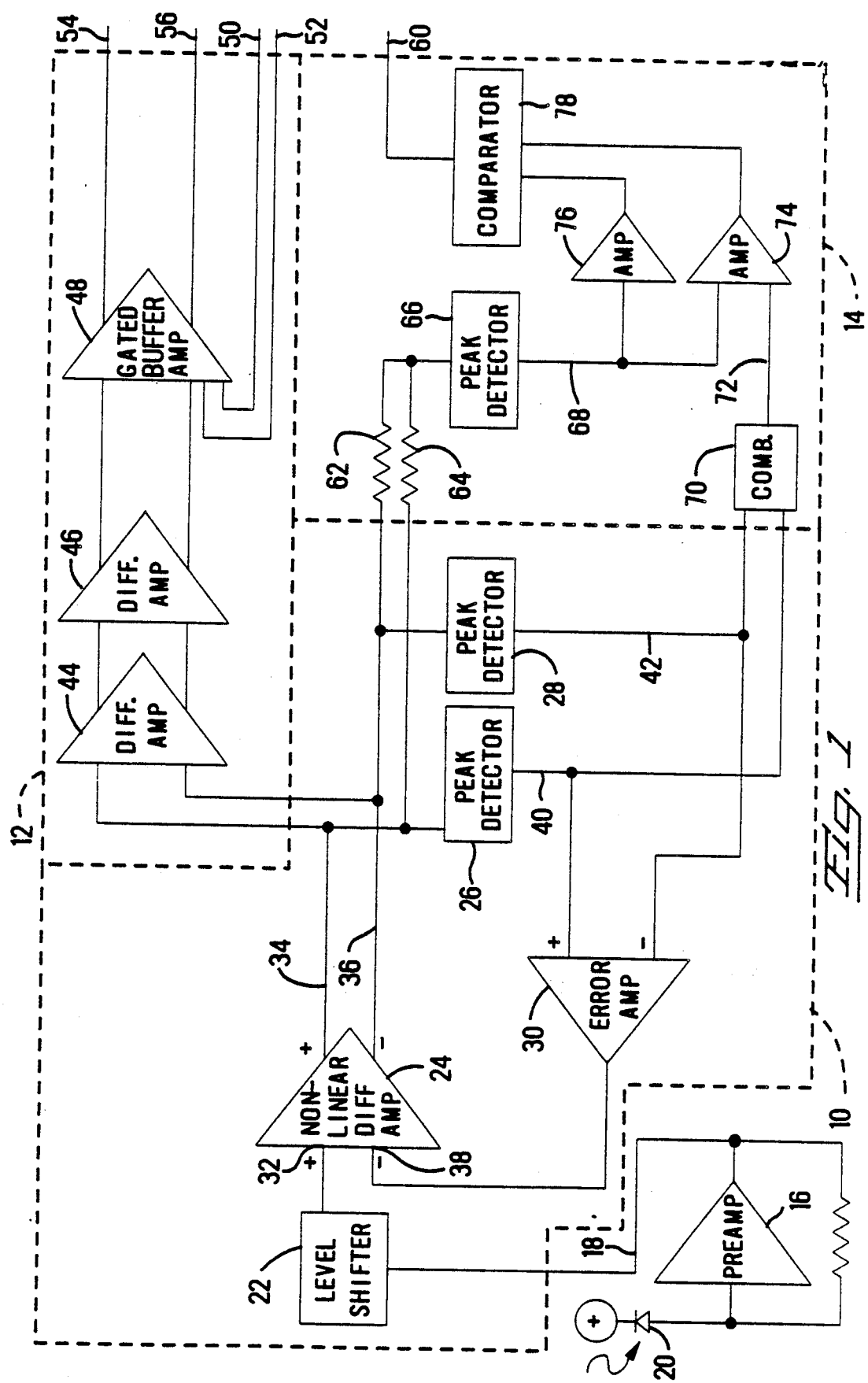
FIG. 1 is a block diagram of a receiver system constructed in accordance with the principles of this invention.

FIG. 1 illustrates a receiver system constructed in accordance with the principles of this invention. Functionally, the receiver system shown in FIG. 1 can be considered to comprise three sections. These three sections include the elements enclosed within the blocks defined by the broken lines and include the front end section 10, the post amplifier section 12, and the signal detection section 14. As discussed above, the receiver system shown in FIG. 1 is particularly adapted for use in a fiber optic system. The input to the receiver system is the output of the preamplifier 16 on the lead 18, the input to the preamplifier 16 being the output of a photodetector 20 upon which there is directed light from the fiber optic transmission medium.

The front end section 10 includes the level shifter 22, the non-linear differential amplifier 24, the peak detectors 26 and 28, and the error amplifier 30. The function of the level shifter 22 is to raise the DC offset voltage of the preamplifier 16 output on the lead 18 so that it is within the common mode range of the amplifier 24. As will be described in full detail hereinafter, the amplifier 24 is a non-linear differential amplifier having a gain characteristic which is designed to have a break point at an input difference level of approximately +/−50 millivolts. Thus, the differential gain of the amplifier 24 is at a maximum for input difference voltages below the break point and is reduced for input difference voltages above the break point, thereby insuring that the amplifier 24 does not clip over the dynamic range of the output of the preamplifier 16. The peak detectors 26 and 28 hold at their outputs the maximum positive peak excursions of the positive and negative outputs, respectively, of the amplifier 24. The error amplifier 30, which can be considered to be an operational amplifier, provides at its output to the negative input of the amplifier 24 the threshold voltage for quantizing the input signal.

The operation of the front end section 10 is best understood with reference to FIGS. 2A-2C. When referring to the waveforms shown in FIGS. 2A-2C, each waveform is designated with a primed reference numeral, where that reference numeral refers to the lead on which the waveform appears. Thus, for example, the waveform 32' designates the waveform of the signal at the positive input 32 of the differential amplifier 24. Initially, it should be noted that the output of the preamplifier 16 on the lead 18 is modulated in a negative direction when light impinges on the photodetector 20. Before a transmission, when no light impinges on the photodetector 20, the signal on the lead 18 is high and the signal at the positive input 32 to the amplifier 24 is likewise high. This is a stable state condition where the positive and negative outputs 34 and 36, respectively, of the differential amplifier 24 are equal. Likewise, the outputs of the peak detectors 26 and 28 are equal and the level of the output of the error amplifier 30 to the negative input 38 of the differential amplifier 24 equals the level of the positive input 32 of the differential amplifier 24.

As the first light pulse illuminates the photodetector 20, the output of the preamplifier 16 on the lead 18 goes low, causing the positive input 32 of the differential amplifier 24 to go low (see FIG. 2A). The positive output 34 of the differential amplifier 24 then goes low and the negative output 36 of the differential amplifier 24 goes correspondingly high (see FIG. 2B). The peak detector 28 coupled to the negative output 36 tracks and holds the increasing voltage at its output 42, while the peak detector 26 coupled to the positive output 34 retains its previous voltage on its output 40, with some slight decay (see FIG. 2C). This change in the relative levels of the outputs of the peak detectors 26 and 28 creates a negative difference at the inputs of the error amplifier 30. Accordingly, the output of the error amplifier 30 applied to the negative input 38 of the differential amplifier 24 is driven low, at a controlled rate (see FIG. 2A). This action changes the positive and negative differences at the inputs to the differential amplifier 24 during the next received light pulse, making them closer in absolute magnitude. The positive difference is made larger while the negative difference is made smaller. This forces the positive excursion of the positive output 34 of the differential amplifier 24 to rise and the positive excursion of the negative output 36 of the differential amplifier 24 to fall. The outputs 40 and 42 of the peak detectors 26 and 28, respectively, track these changes and provide them as inputs to the error amplifier 30 (see FIG. 2C). This process continues until the positive and negative input differences at the input 32 of the differential amplifier 24 are equalized with respect to the threshold level applied to the input 38 of the differential amplifier 24. When this condition is met, the positive excursions of the differential amplifier 24 outputs 34 and 36 will be equal and therefore the outputs of the peak detectors 26 and 28 will be equal (see FIG. 2C). The error amplifier 30 will no longer attempt to vary its output, which now provides a threshold at the midpoint of the range of the signal applied to the input 32 of the differential amplifier 24 (see FIG. 2A).

The outputs of the differential amplifier 24 on the leads 34 and 36 are shown in FIG. 2B. These output signals are applied to the post amplifier section 12 and, in particular, to the input of the differential limiting amplifier 44 whose outputs in turn are applied to the differential limiting amplifier 46. These amplifiers 44 and 46 amplify and clip the signals whose waveforms are shown in FIG. 2B so that they approach, in form, square waves. The amplified and clipped signals are then applied to the input of the gated buffer amplifier 48. The amplifier 48 is similar to the amplifiers 44 and 46 in that it amplifies and clips a signal at its input. However, the amplifier 48 may be gated by signals applied to the leads 50 and 52 and is arranged so that when a positive signal is applied to the lead 50 the data outputs on the leads 54 and 56 reflect the received data, whereas when a positive signal is applied to the lead 52 the amplifier 48 is latched into a controlled state so as to apply a predetermined steady data signal to the leads 54 and 56. It is noted that the signals on the leads 50 and 52 must be complementary.

The function of the signal detection section 14 is to provide on the lead 60 an appropriate logic flag to indicate whether or not a sufficient signal to noise ratio exists in the incoming signal to acquire reliable received data. Thus, outputs of the non-linear differential amplifier 24 on the leads 34 and 36 are applied through the resistor divider network including the resistors 62 and 64 to provide as an input to the peak detector 66 the average level of the outputs of the differential amplifier 24. This average level does not change, so that the output of the peak detector 66 on the lead 68 is this average level. The reason that a peak detector 66 is utilized is that if the peak detector 66 is of the same construction as the peak detectors 26 and 28, it provides compensation for any voltage and temperature variations that would effect the outputs of the peak detectors 26 and 28. Thus, the signal on the lead 68 is used as a tracking reference. The outputs of the peak detectors 26 and 28 are applied to the combiner circuit 70 which provides on its output 72 a signal which is the average of the peaks of the outputs of the differential amplifier 24. The average of the peaks of the outputs on the lead 72 is greater than the average of the outputs on the lead 68. Both of these signals are applied to the amplifier 74 which provides as an input to the comparator 78 a signal which is the difference between the peak average and the output average. The output average reference signal on the lead 68 is applied to the amplifier 76, which is identical to the amplifier 74 with the exception that its inputs are tied together. Accordingly, the comparator 78 compares the difference signal from the amplifier 74 with the compensated reference signal from the amplifier 76 to make a determination of the signal to noise ratio. The output of the comparator circuit 78 on the lead 60 is low if the signal to noise ratio is sufficiently high to indicate reliable received data, and is high otherwise.

FIG. 3 shows a schematic circuit diagram for an illustrative non-linear differential amplifier 24. Preferably, all of the circuitry encompassing the front end section 10, the post amplifier section 12, and the signal detection section 14 (FIG. 1) is incorporated into a single integrated circuit. Illustratively, this integrated circuit is an Application Specific Integrated Circuit (ASIC) and there will thus be limitations on the elements which can be utilized to make up the individual amplifiers, peak detectors, etc. The non-linear differential amplifier 24 shown in FIG. 3 can be considered to be a gain compressing differential amplifier which takes advantage of the multiple emitter structure of the semiconductor devices 80 and 82. Two sets of emitters are tied together, each pair being sourced by current sources 84 and 86, respectively. This provides relatively large amplification for small signals. The third pair of emitters are sourced by current source 88, but these are degenerated by the resistors 90 and 92 so as to extend the linear range of this last pair of emitters. This insures that the amplifier 24 will not limit over the entire dynamic range of the output of the preamplifier 16 so that peak information is not lost. The transistors 94 and 96 are emitter followers that buffer the outputs of the amplifier 24. The Schottky diodes 98 provide a level shift to the peak detector circuits 26 and 28. The amplifier could also be constructed using multiple, single emitter devices where multiple emitter devices are not available. The essential feature of this amplifier design is the concept of differential pairs, with common inputs, feeding the same load resistors, 83 and 85, but each having different amounts of degeneration and, accordingly, different linear ranges and gain characteristics.

Figure 4:
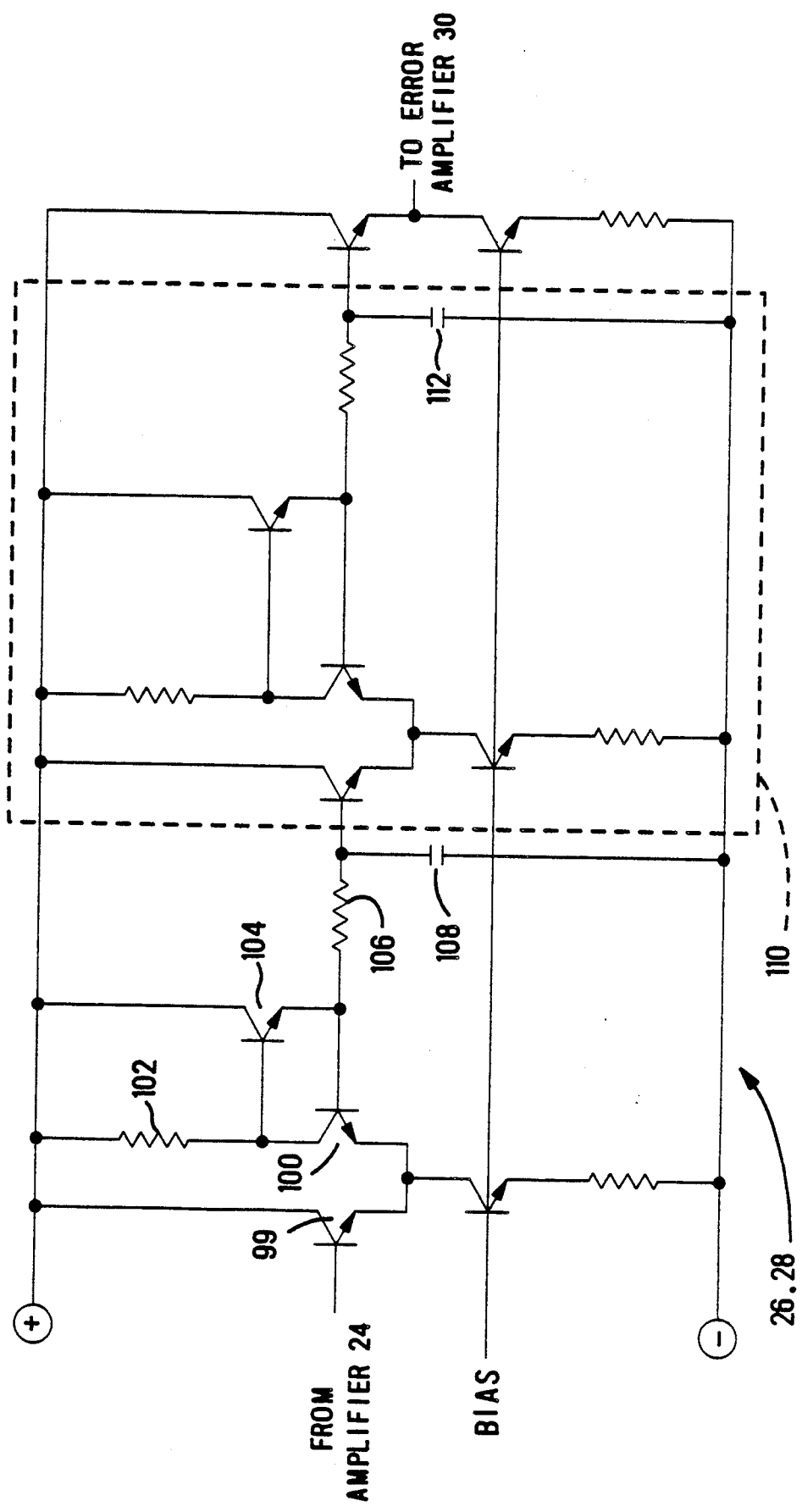
FIG. 4 is a detailed schematic diagram of an illustrative peak detector circuit which may be used in the system shown in FIG. 1.

FIG. 4 shows illustrative circuitry for the peak detectors 26, 28. The peak detector circuit shown in FIG. 4 may be considered to be an ideal-diode type circuit. The central part of the peak detector circuit is the amplifier formed by the transistor 99, the transistor 100 and the resistor 102. The transistor 104 introduces unity gain feedback, which insures that the voltages at the bases of the transistors 99 and 100 are equal. The resistor 106 is a current limiting resistor, beyond which is a storage capacitor 108 connected to the negative rail. The capacitor 108 is charged by the transistor 104 during positive excursions of the input voltage from the amplifier 24, and is only discharged by the base currents of the transistor 100. The storage capacitor 108 therefore remembers the previous high positive excursion of the input voltage. If the width of the input pulses was constant and known, the value of the capacitor 108 could be chosen with precision. However, in the particular application for which the present system was developed, the pulse widths can be as narrow as a few nanoseconds, or as wide as a few hundred nanoseconds. To accurately retain the peak level for a long time (low droop), a large capacitor is required. However, if the pulses are very narrow, the large capacitor is difficult to charge accurately. Accordingly, the peak detector circuit shown in FIG. 4 is designed as a two stage peak detector. The second stage, enclosed within the broken lines and designated by the reference numeral 110, is identical to the first stage, with the exception of the value of the storage capacitor 112. Thus, the storage capacitor 108 is a relatively small capacitor, which is easily charged during narrow pulses, and relatively quickly bled off as well. On the other hand, the storage capacitor 112 is a large capacitor, which is bled off slowly to retain accuracy during long duration input pulses. The result is that the capacitor 108 effectively stretches the width of narrow pulses so that the second stage storage capacitor 112 can accurately acquire the peak. The use of this two stage peak detector design results in acceptable accuracy and speed of the peak detection. The peak detector 66 (FIG. 1) utilizes the same circuitry as shown in FIG. 4, but without the capacitors 108 and 112. Its input is the midpoint of the input voltages to the peak detectors 26, 28.

Figure 5:
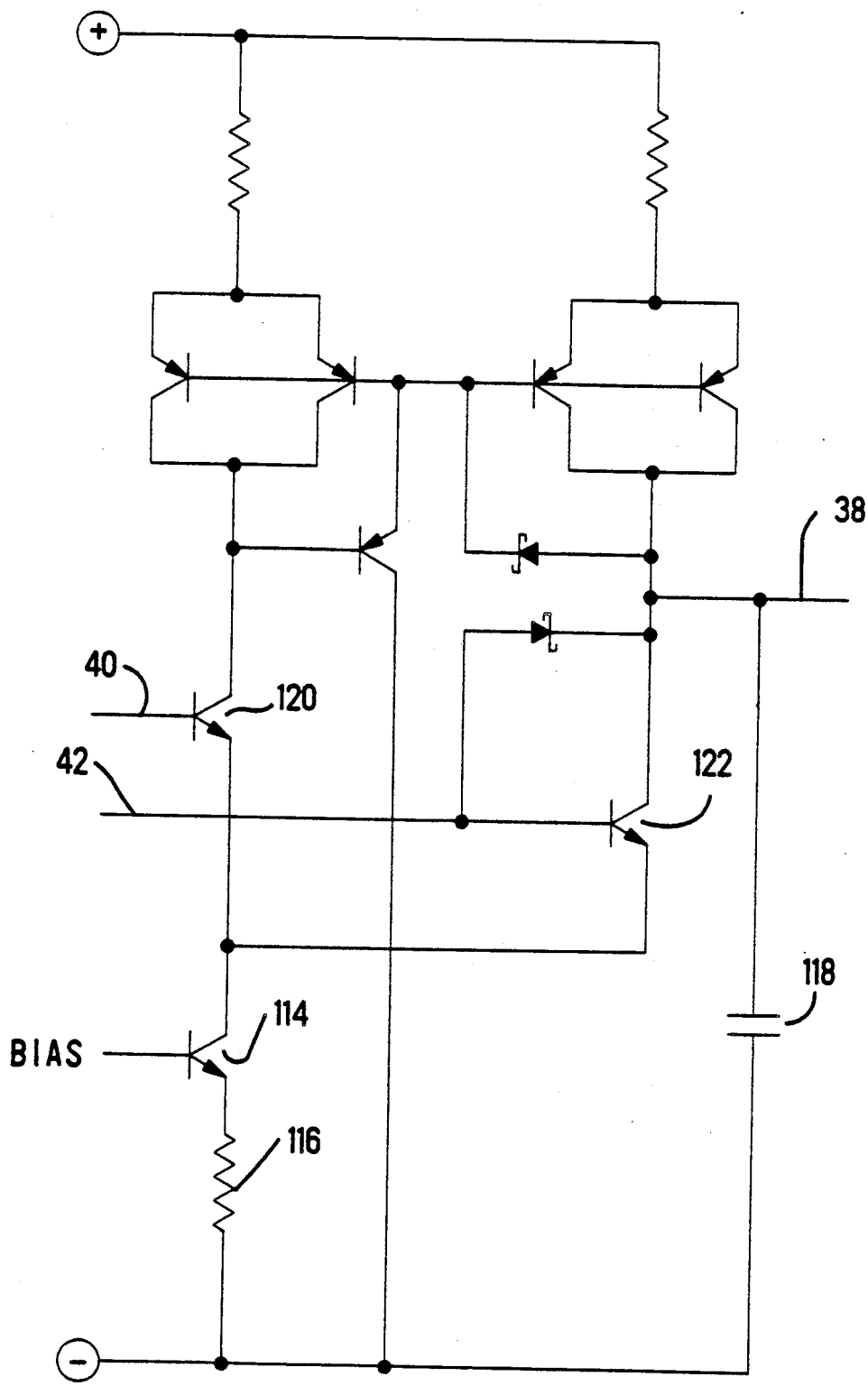
FIG. 5 is a detailed schematic diagram of an illustrative error amplifier circuit which may be used in the system shown in FIG. 1.

FIG. 5 shows illustrative circuitry for implementing the error amplifier 30 (FIG. 1). The error amplifier 30 is an operational amplifier with an open loop gain of approximately 400. The high gain of this amplifier makes the offset of the threshold voltage very low. A one milliampere current source including the transistor 114 and the resistor 116 sources the differential amplifier portion of the error amplifier 30. A large value capacitor 118 is connected between the output 38 of the amplifier 30 and the negative rail. The amplifier 30 operates mainly in a "charge-pump" mode to provide a very well controlled slew rate of the threshold voltage. When the transistor 120 is on and the transistor 122 is off, one milliampere of current is pumped into the capacitor 118, thereby raising the threshold voltage. When the transistor 122 is on and the transistor 120 is off, the transistor 122 pulls one milliampere of current out of the capacitor 118, thereby lowering the threshold voltage. When both of the transistors 120 and 122 are in their linear regions, the high gain of this actively loaded transistor pair insures that the threshold offset is low.

There has thus been described improved quantizing circuitry for transforming an input signal into a two level logic signal. While a preferred embodiment has been disclosed, it will be apparent to one of ordinary skill in the art that various modifications and adaptations to the disclosed arrangement can be made without departing from the spirit and scope of this invention, which is only intended to be limited by the appended claims.

What is claimed is:

1. A system for quantizing an input signal to two levels, said input signal varying in a range between a first voltage level and a second voltage level, the system comprising:

means for receiving said input signal;

differential sensing means responsive to said input signal and a threshold voltage for providing a pair of output signals each corresponding to a respective polarity of the difference between said input signal and said threshold voltage, said differential sensing means including a differential amplifier having first and second inputs and first and second outputs, said first input being coupled to receive said input signal and said second input being coupled to receive said threshold voltage; and means for providing said threshold voltage at a level which is the midpoint of said input signal range, said threshold voltage providing means including a feedback loop around said differential amplifiers, said feedback loop having a first peak detector coupled to said differential amplifier first output and a second peak detector coupled to said differential amplifier second output.

2. The system according to claim 1 wherein said feedback loop further includes an error amplifier having a first input coupled to said first peak detector, a second input coupled to said second peak detector, and an output coupled to said second input of said differential amplifier.

3. The system according to claim 1 wherein said differential amplifier has a non-linear gain characteristic with a higher slope at the low end of its input range than at the high end of its input range.

4. The system according to claim 3 wherein said differential amplifier includes first and second multi-emitter semiconductor devices, a first pair of emitters being coupled together to a first current source to form a first differential amplifier combination and a second pair of emitters being coupled together through first and second degenerating resistors to a second current source to form a second differential amplifier combination having lower gain than said first differential amplifier combination.

5. The system according to claim 3 wherein said differential amplifier includes first and second differentially coupled pairs of transistors, the inputs of the first differential pair being common with the respective inputs of the second differential pair, the collectors of the first and second differential pairs feeding the same respective load resistors, and the emitters of the first and second differential pairs being connected to respective current sources with respective amounts of resistive degeneration to provide for each differential pair a respective linear range and gain characteristic, whereby a composite non-linear gain characteristic is obtained for said differential amplifier.

6. The system according to claim 1 wherein each of said first and second peak detectors is constructed as a two stage peak detector with the first stage having a relatively fast time constant and the second stage having a relatively slow time constant.

7. The system according to claim 6 wherein each of the peak detector stages includes an amplifier followed by a storage capacitor.

8. The system according to claim 7 wherein the storage capacitor of the first peak detector stage is a relatively small capacitor to accurately detect narrow input pulses and the storage capacitor of the second peak detector stage is a relatively large capacitor to retain the peaks for long periods of time.

9. The system according to claim 2 wherein said error amplifier comprises a high open loop gain operational amplifier including a differential amplifier feeding an output capacitor.

10. The system according to claim 2 further including amplifying means coupled to the outputs of said differential amplifier for amplifying and clipping the signal on the outputs of said differential amplifier.

11. The system according to claim 2 further including signal detection means coupled to the outputs of said differential amplifier and said peak detectors for determining whether a sufficient signal to noise ratio exists in said input signal to acquire reliable received data.

12. The system according to claim 11 wherein said signal detection means includes:

means for averaging the output signals of said differential amplifier;

a third peak detector identical to said first and second peak detectors for receiving the averaged differential amplifier output signals and providing a reference signal;

means for averaging the outputs of the first and second peak detectors;

means for generating a signal representative of the difference between the averaged peak detector output signals and the reference signal; and means for comparing the generated difference signal to the reference signal.

* * * * *